United States Patent
Emoto et al.

(10) Patent No.: US 8,020,287 B2
(45) Date of Patent: Sep. 20, 2011

(54) CHANGING METHOD FOR SEPARATION FACILITATION HEAD IN CHIP MOUNTING APPARATUS

(75) Inventors: Yasuhiro Emoto, Fukuoka (JP); Yasuo Takanami, Fukuoka (JP)

(73) Assignee: Panasonic Corporation, Osaka (JP)

( * ) Notice: Subject to any disclaimer, the term of this patent is extended or adjusted under 35 U.S.C. 154(b) by 793 days.

(21) Appl. No.: 12/098,862

(22) Filed: Apr. 7, 2008

(65) Prior Publication Data
US 2008/0247143 A1   Oct. 9, 2008

(30) Foreign Application Priority Data
Apr. 9, 2007   (JP) .................................. 2007-101503

(51) Int. Cl.
*H05K 3/30* (2006.01)
(52) U.S. Cl. .......... 29/834; 29/739; 29/832; 414/331.18
(58) Field of Classification Search .................... 29/739, 29/740, 743, 832, 834; 414/223.02, 331.18, 414/744.3
See application file for complete search history.

(56) References Cited

U.S. PATENT DOCUMENTS
5,839,187 A * 11/1998 Sato et al. ........................ 29/743
7,047,632 B2 *  5/2006 Arikado .......................... 29/832

FOREIGN PATENT DOCUMENTS
JP    2005-129754    5/2005

* cited by examiner

*Primary Examiner* — Donghai D. Nguyen
(74) *Attorney, Agent, or Firm* — Pearne & Gordon LLP

(57) ABSTRACT

In a chip mounting apparatus, a structure is employed that a separation facilitation head keeping part is provided for detachably keeping a plurality kinds of separation facilitation heads in a wafer ring holding part and a chip separation facilitation unit is allowed to access to the separation facilitation head keeping part by a moving mechanism to automatically carry out a changing operation for changing the separation facilitation head between the separation facilitation head keeping part and a separation facilitation head attaching part provided in the chip separation facilitation unit without annoying operator's hands. Thus, the separation facilitation head can be automatically changed to improve the operation rate of the apparatus.

2 Claims, 9 Drawing Sheets

CHANGING METHOD FOR SEPARATION FACILITATION HEAD IN CHIP MOUNTING APPARATUS

BACKGROUND OF THE INVENTION

1. Field of the Invention

The present invention relates to a chip mounting apparatus for mounting a chip on a substrate and a changing method for a separation facilitation head in the chip mounting apparatus.

2. Related Art

Chip parts such as semiconductor chips supplied under a wafer state have been hitherto mounted on a substrate such as a lead frame by a chip mounting apparatus having an exclusive feeder. The chip parts divided into individual pieces are stuck to and held on an adhesive sheet, and the adhesive sheet is supplied under a state that the adhesive sheet is held by a wafer ring. When the chip is picked up, the chip is pushed upward from a lower surface side by an ejector head (a separation facilitation head). Thus, the separation of the chip is facilitated from the adhesive sheet and picked up by a pick-up nozzle. Then, when all the semiconductor chips are picked up from one wafer ring, an empty wafer ring is replaced by a new wafer ring by a changing device having gripping and carrying functions (for instance, see JP-A-2005-129754).

In recent years, in the field of a production of electronic devices, a form that a small quantity of many kinds of devices is produced has been ordinarily employed. In the above-described chip mounting apparatus, a type meeting many kinds of products has been requested that can carry out a mounting operation of many kinds of semiconductor chips having different sizes as objects. Therefore, during the operation of the chip mounting apparatus, an ejector head highly frequently needs to be changed for an ejector head meeting the form of a corresponding chip. However, in the apparatus disclosed in the JP-A-2005-129754, when the ejector head is changed, a machine operator needs to manually carry out an operation for detaching the ejector head under a state that the operation of the apparatus is stopped. Since this head changing operation is carried out for an ejector mechanism located in a narrow part of the apparatus, workability is low. Further, since the apparatus needs to be stopped while the changing operation is carried out, this operation is a factor that makes the operation rate of the apparatus to be deteriorated.

SUMMARY OF THE INVENTION

Thus, it is an object of the present invention to provide a chip mounting apparatus in which a separation facilitation head can be automatically changed and a method of changing such a separation facilitation head to improve the operation rate of the apparatus.

A chip mounting apparatus of the present invention concerns a chip mounting apparatus that mounts on a substrate a chip supplied under a state that the chip is stuck to a wafer sheet. The chip mounting apparatus comprises: a substrate holding part that holds the substrate; a wafer ring holding part that holds a wafer ring on which the wafer sheet is extended; a mounting head that mounts the chip picked up from the wafer sheet on the substrate held on the substrate holding part; a chip separation facilitation unit provided with a separation facilitation head that facilitates the separation of the chip from the wafer sheet when the chip is picked up from the wafer sheet; a unit moving device that moves the chip separation facilitation unit horizontally relatively to the wafer ring holding part; and a separation facilitation head keeping part that is provided below the wafer ring holding part within a range accessible by the chip separation facilitation unit through the unit moving device to detachably keep a plurality of kinds of separation facilitation heads in horizontal positions. The chip separation facilitation unit includes a separation facilitation head attaching part to which the separation facilitation head is detachably attached, a position changing unit that changes the position of the separation facilitation head attaching part at least to a horizontal direction and a vertical direction and an actuation unit that moves the position of the separation facilitation head attaching part upward and downward, and further includes a control unit that controls the unit moving device, the separation facilitation head keeping part, the position changing unit and the actuation unit to carry out a head changing operation for changing the separation facilitation head between the separation facilitation head keeping part and the separation facilitation head attaching part.

A changing method for a separation facilitation head in the chip mounting apparatus of the present invention concerns a separation facilitation head changing method for changing the separation facilitation head in the chip mounting apparatus that mounts on a substrate a chip supplied under a state that the chip is stuck to a wafer sheet and comprises: a substrate holding part that holds the substrate; a wafer ring holding part that holds a wafer ring on which the wafer sheet having a plurality of chips stuck is extended; a mounting head that mounts the chip picked up from the wafer sheet on the substrate held on the substrate holding part; a chip separation facilitation unit provided with a separation facilitation head that facilitates the separation of the chip from the wafer sheet when the chip is picked up from the wafer sheet; a unit moving device that moves the chip separation facilitation unit horizontally relatively to the wafer ring holding part; and a separation facilitation head keeping part that is provided below the wafer ring holding part within a range accessible by the chip separation facilitation unit through the unit moving device to detachably keep a plurality of kinds of separation facilitation heads in horizontal positions. The separation facilitation head changing method comprises: a position changing step that changes the position of a separation facilitation head attaching part to which the separation facilitation head is detachably attached in the chip separation facilitation unit at least to the horizontal direction and the vertical direction; an access step that allows the chip separation facilitation unit to access to the separation facilitation head keeping part; and a head delivery step that delivers the separation facilitation head between the separation facilitation head keeping part and the separation facilitation head attaching part.

According to the present invention, a structure is employed that the separation facilitation head keeping part which detachably keeps a plurality of kinds of separation facilitation heads is provided in the wafer ring holding part to automatically carry out a head changing operation for changing the separation facilitation head between the separation facilitation head keeping part and the separation facilitation head attaching part, so that the separation facilitation head can be automatically changed to improve the operation rate of the apparatus.

DETAILED DESCRIPTION OF THE PREFERRED EMBODIMENTS

Figure 1:
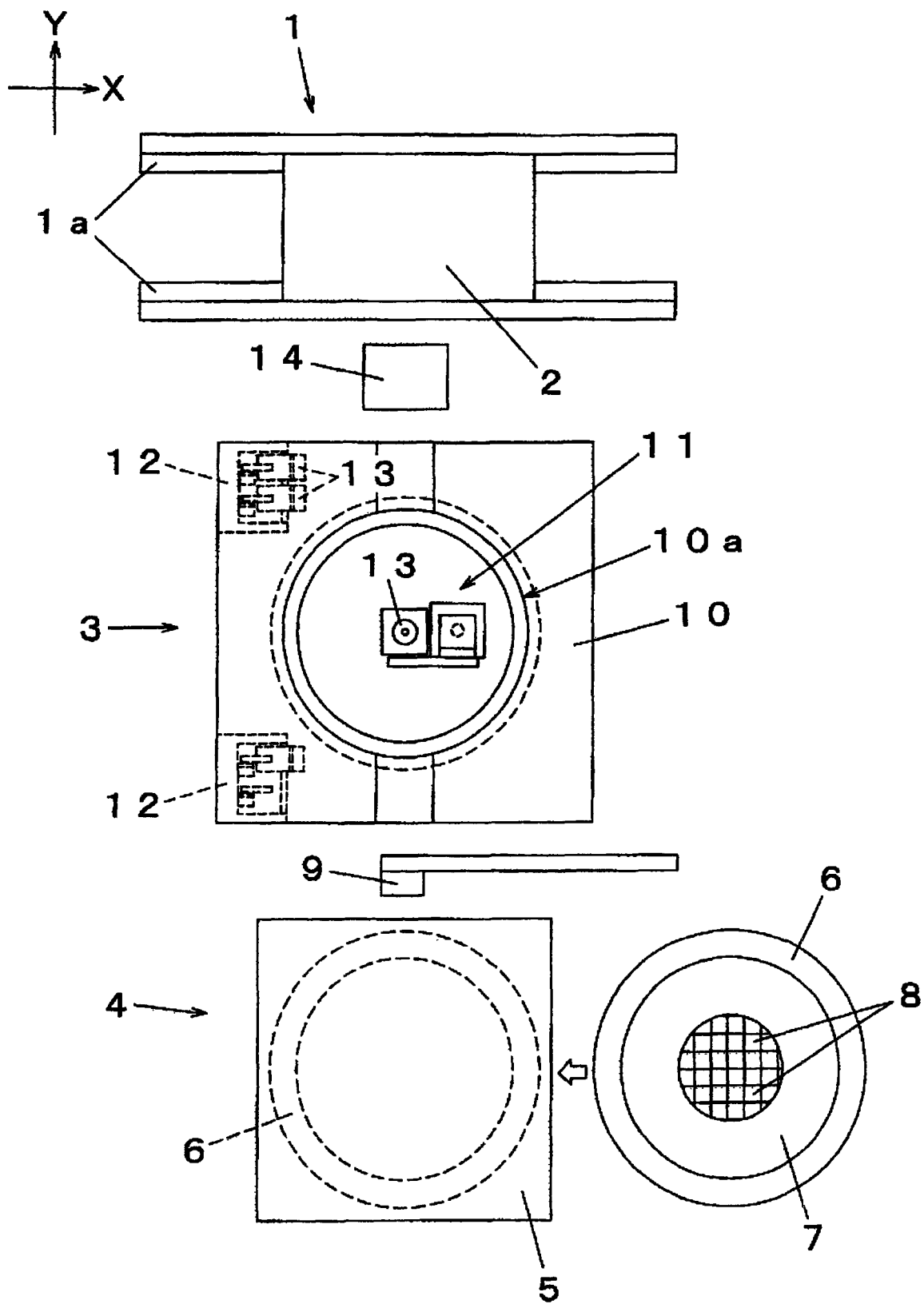
FIG. 1 is a plan view of a chip mounting apparatus of one embodiment of the present invention.
Figure 2:
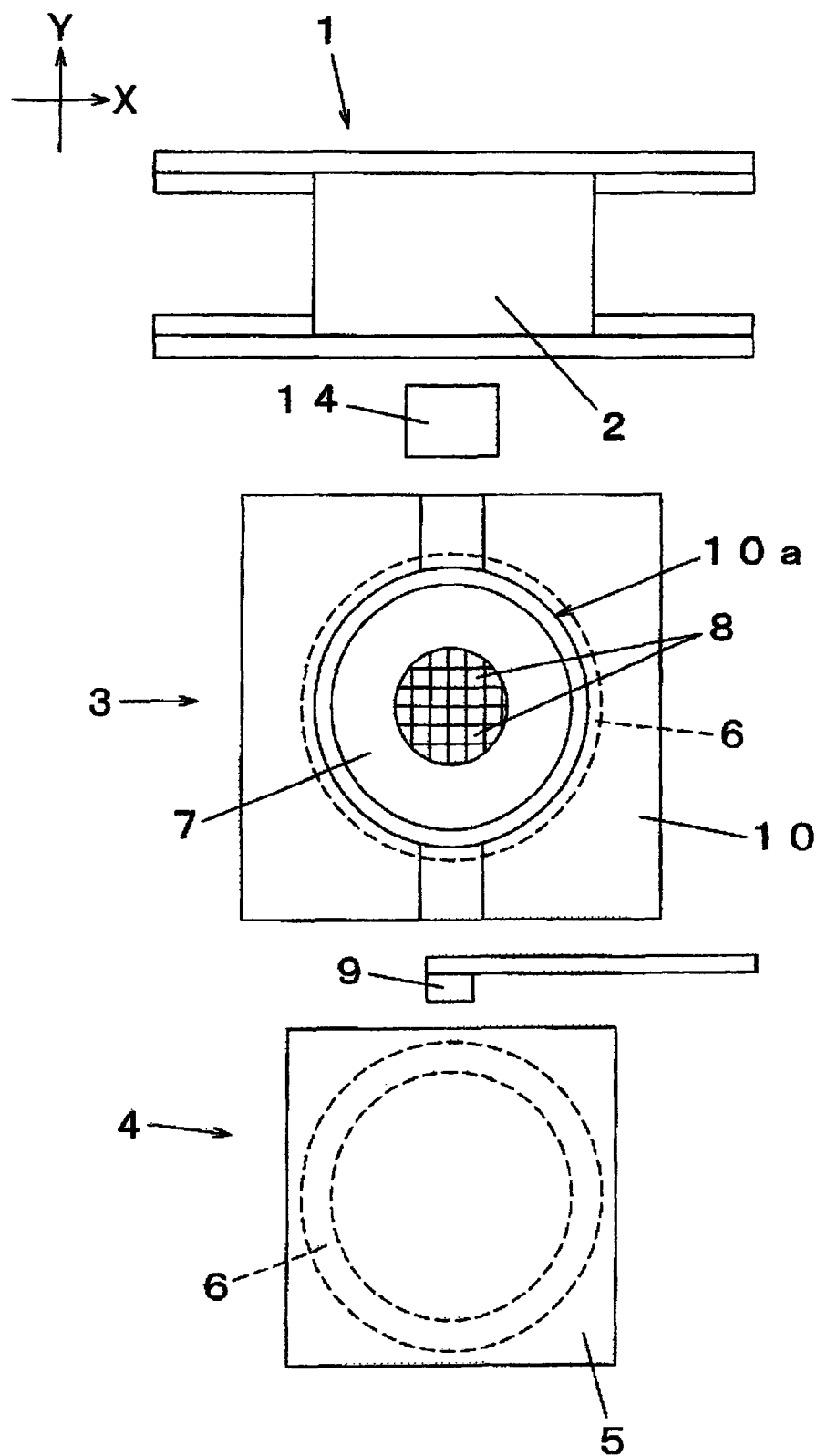
FIG. 2 is a plan view of the chip mounting apparatus of the embodiment of the present invention.
Figure 3A:
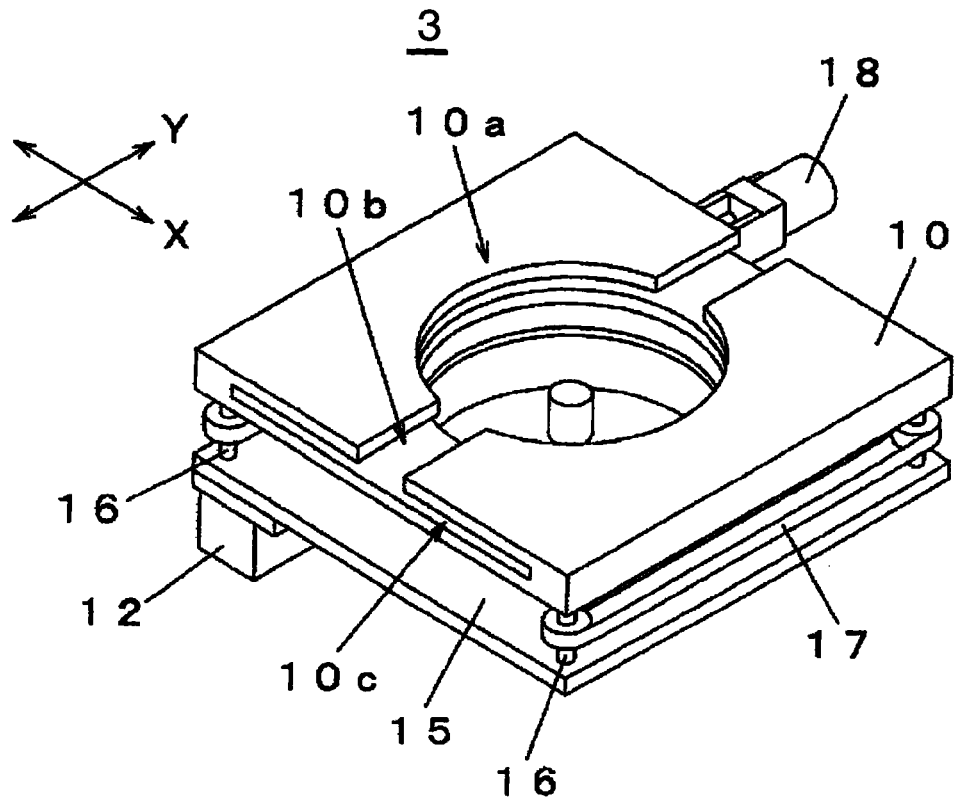
FIG. 3A is a perspective view of a wafer positioning part of the chip mounting apparatus of the embodiment of the present invention.
Figure 3B:
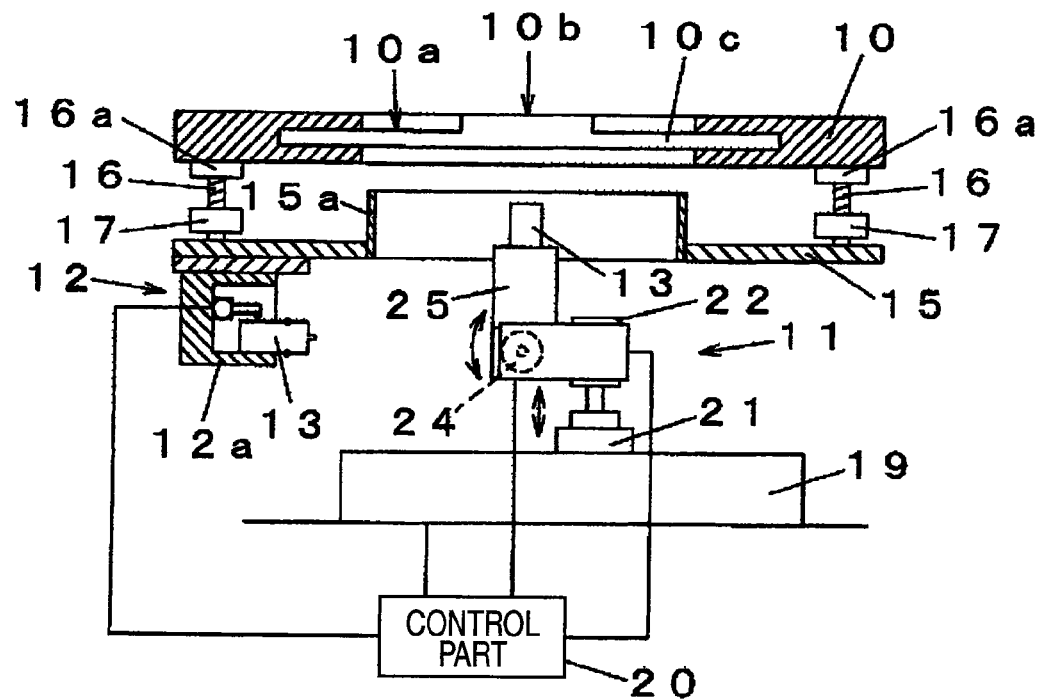
FIG. 3B is a sectional view of the wafer positioning part of the chip mounting apparatus of the embodiment of the present invention.
Figure 4:
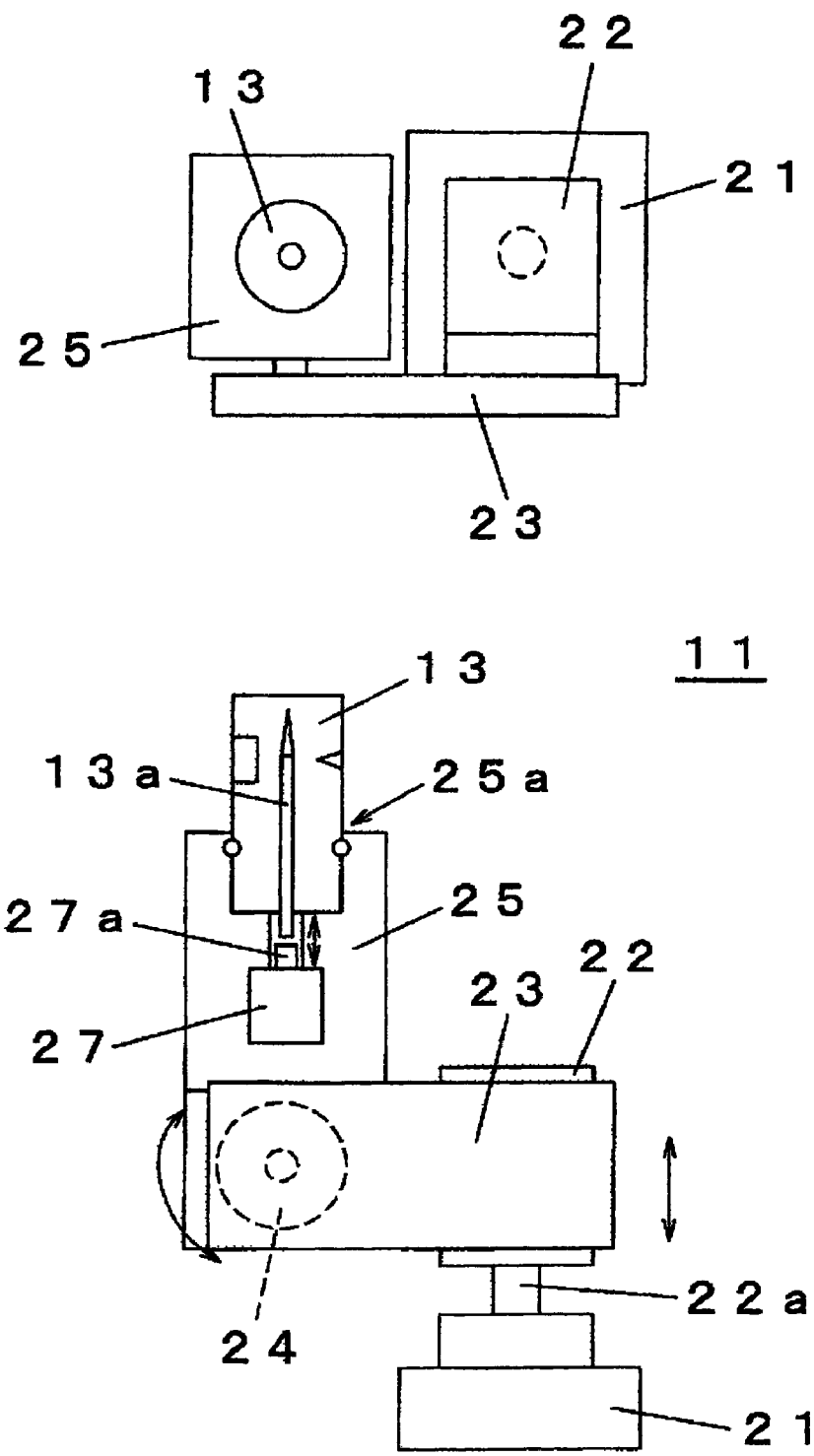
FIG. 4 is an explanatory view of a structure of a chip separation facilitation unit in the chip mounting apparatus of the embodiment of the present invention.
Figure 5A:
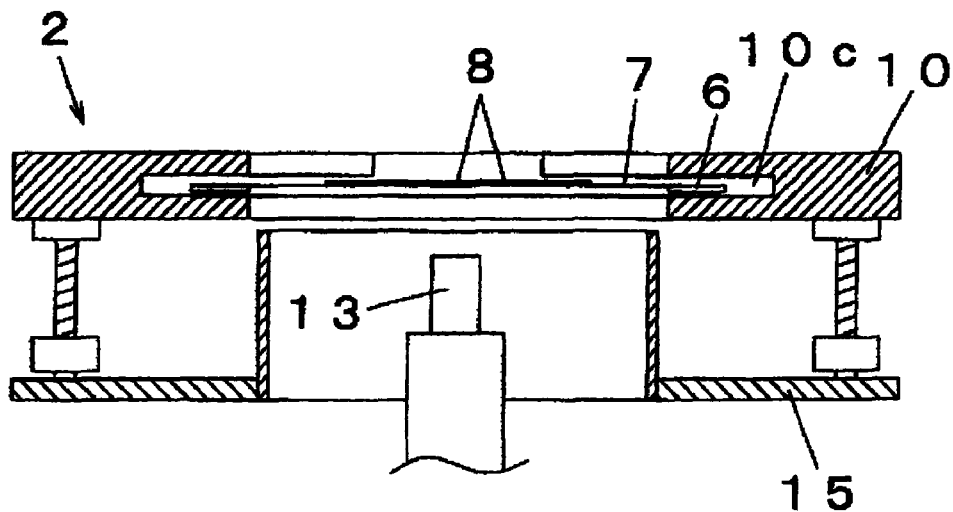
FIGS. 5A, 5B and 5C are explanatory views of the structure of the wafer positioning part of the chip mounting apparatus of the embodiment of the present invention.
Figure 5B:
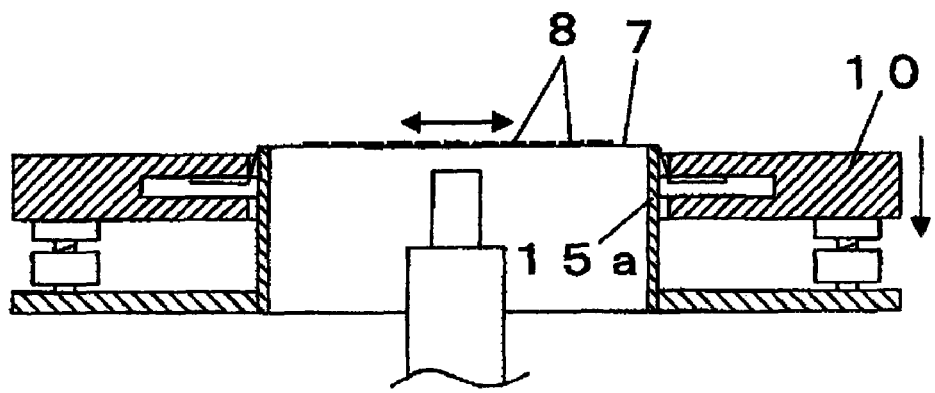
Figure 5C:
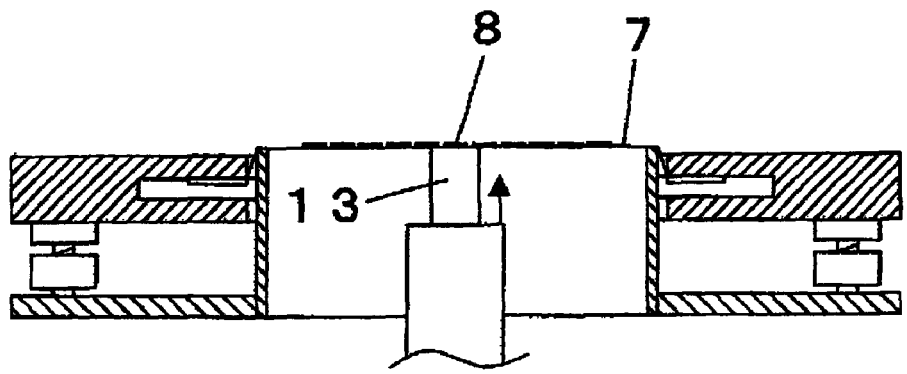
Figure 6A:
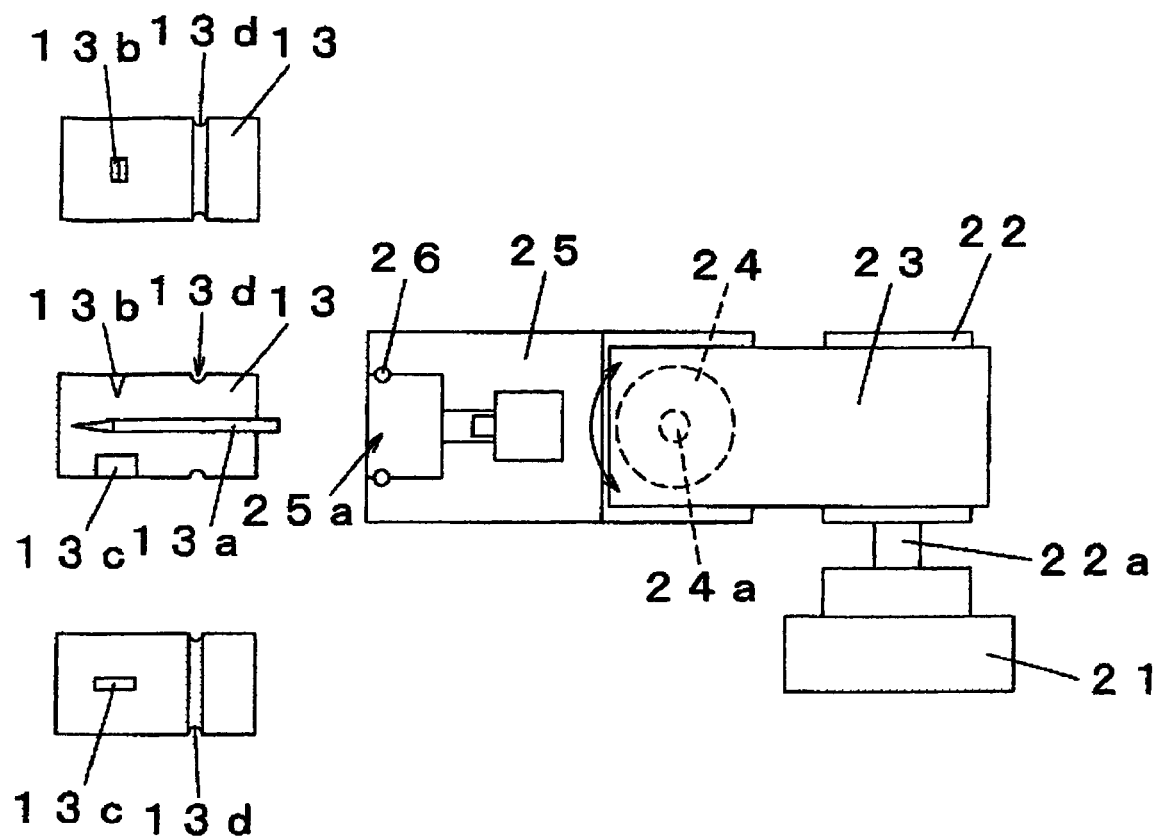
FIGS. 6A and 6B are explanatory views of a structure for attaching and detaching a separation facilitation head in the chip mounting apparatus of the embodiment of the present invention.
Figure 6B:
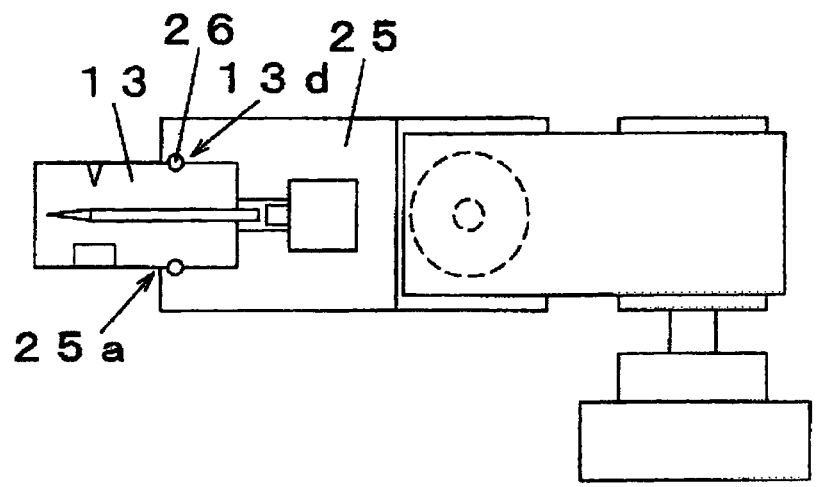
Figure 7B:
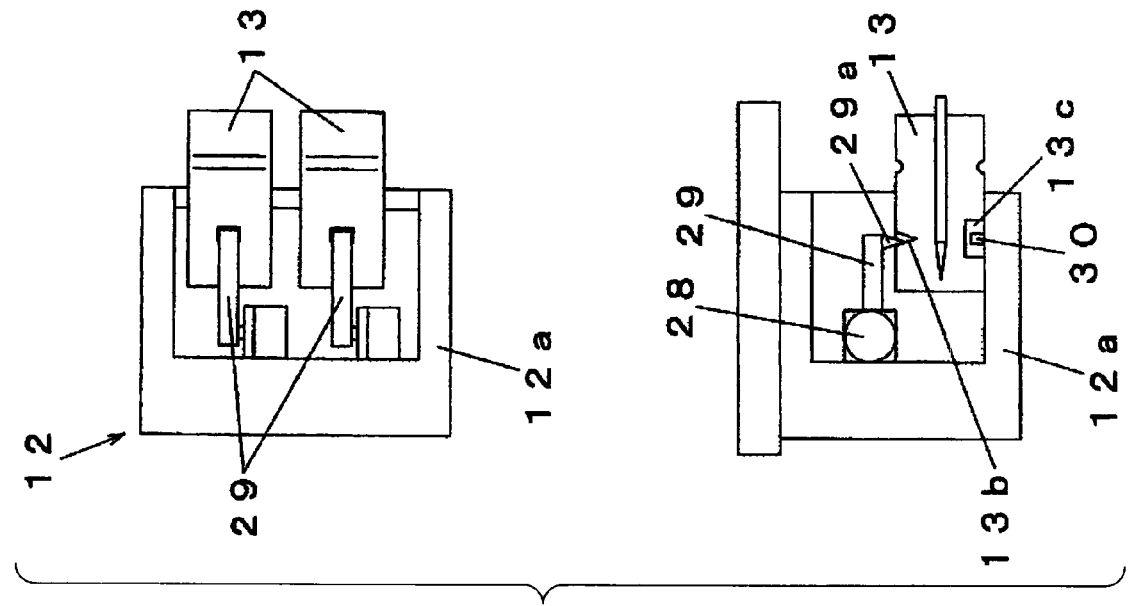
FIGS. 7A and 7B are explanatory views of a structure of a separation facilitation head keeping part in the chip mounting apparatus of the embodiment of the present invention.
Figure 7A:
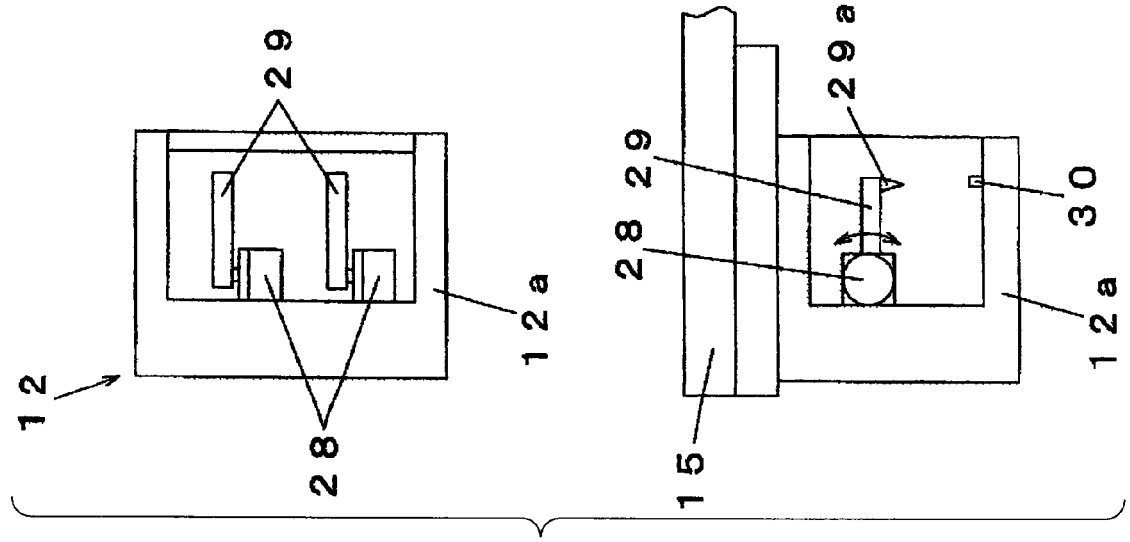

Now, an embodiment of the present invention will be described below by referring to the drawings. FIGS. 1 and 2 are plan views of a chip mounting apparatus of one embodiment of the present invention. FIG. 3A is a perspective view of a wafer positioning part of the chip mounting apparatus of the embodiment of the present invention. FIG. 3B is a sectional view of the wafer positioning part in the chip mounting apparatus of the embodiment of the present invention. FIG. 4 is an explanatory view of a structure of a chip separation facilitation unit in the chip mounting apparatus of the embodiment of the present invention. FIGS. 5A, 5B and 5C are explanatory views of an operation of the wafer positioning part of the chip mounting apparatus of the embodiment of the present invention. FIGS. 6A and 6B are explanatory views of a structure for detachably attaching a separation facilitation head in the chip mounting apparatus of the embodiment of the present invention. FIGS. 7A and 7B are explanatory views of a structure of a separation facilitation head keeping part in the chip mounting apparatus of the embodiment of the present invention. FIGS. 8A through 9D are explanatory views of an operation for changing the separation facilitation head in the chip mounting apparatus of the embodiment of the present invention.

Initially, by referring to FIG. 1, an entire structure of the chip mounting apparatus will be described. The chip mounting apparatus has a function for mounting a semiconductor chip (describe it simply as a "chip", hereinafter) supplied under a state that the chip is stuck to a wafer sheet on a substrate. In FIG. 1, the chip mounting apparatus includes a substrate holding part 1, a wafer ring holding part 3 and a wafer ring supply part 4. The substrate holding part 1 is provided with a substrate carrying conveyor 1a arranged in a direction X. A substrate 2 as an object for mounting carried from an upstream side by the substrate carrying conveyor 1a is positioned and held at a position of a mounting operation.

The wafer ring holding part 3 holds a wafer ring 6 having a wafer sheet 7 extended to which chips 8 mounted on the substrate 2 are stuck. The chips 8 are stuck to the wafer sheet 7 under a state that the chips are divided into individual pieces from a semiconductor wafer. The wafer ring holding part 3 is provided with a wafer holding table 10 having an opening part 10a on an upper surface. In the opening part 10a, a chip separation facilitation unit 11 is arranged to which a separation facilitation head 13 is attached.

The chip separation facilitation unit 11 has a function for pushing up the chip 8, when the chip 8 is picked up from the wafer sheet 7, from a lower part by an ejector pin 13a (see FIG. 4) incorporated in the separation facilitation head 13 to facilitate the separation of the chip 8 from the wafer sheet 7. Further, the wafer ring holding part 3 is provided with a separation facilitation head keeping part 12 for detachably keeping the separation facilitation head 13 attached to the chip separation facilitation unit 11 in a horizontal position.

The wafer ring supply part 4 is provided with a magazine 5 for accommodating the wafer ring 6 held by the wafer ring holding part 3 in a stacking state. The wafer ring 6 in the magazine 5 is picked by a wafer ring moving arm 9 and mounted on the wafer holding table 10. The wafer ring moving arm 9 serves as a wafer ring changing unit for changing the wafer ring 6 mounted on the wafer holding table 10 for other wafer ring 6 accommodated in the magazine 5. When the wafer ring 6 is mounted on the wafer holding table 10, the chip 8 stuck to the wafer sheet 7 is located in the opening part 10a as shown in FIG. 2. Then, the chip 8 located in the opening part 10a is picked up from the wafer sheet 7 by a mounting head 14 and mounted on the substrate 2 held by the substrate holding part 1.

Now, referring to FIGS. 3A and 3B, the structure of the wafer ring holding part 3 will be described. As shown in FIG. 3A, on four corner parts of the upper surface of a base plate 15, feed screws 16 stand upright so as to freely rotate. Nuts 16a to which the feed screws 16 are screwed are connected to the wafer holding table 10 arranged in parallel on the base plate 15. The feed screws 16 are respectively driven and rotated by a motor 18 through driving belts 17. The motor 18 is driven so that the feed screws 16 rotate and the wafer holding table 10 moves upward and downward relative to the base plate 15.

The wafer holding table 10 is a substantially square shaped plate like member. In an intermediate part in the direction of a thickness (a vertical direction), a slit 10c into which the wafer ring 6 can be inserted is provided to pass through in a direction of Y. Further, on the upper surface of the wafer holding table 10, a ring carrying groove 10b is provided in the direction of Y for allowing the wafer ring moving arm 9 picking the wafer ring 6 to pass. As shown in FIG. 3B, in the central part of the wafer holding table 10, the circular opening part 10a is provided to vertically pass through. The size of the opening part 10a has a diameter of an opening through which an expand ring 15a provided in the base plate 15 can be inserted.

In the lower part of the opening part 10a, the separation facilitation head 13 is located in the expand ring 15a and the chip separation facilitation unit 1 is arranged. As shown in FIG. 3B, the chip separation facilitation unit 11 is connected to a horizontal moving mechanism 19 through a connecting member 21. The moving mechanism 19 is driven so that the chip separation facilitation unit 11 is movable in a horizontal direction. The moving mechanism 19 serves as a unit moving device for moving horizontally the chip separation facilitation unit 11 relatively to the wafer holding table 10.

The above-described separation facilitation head keeping part 12 is provided below the wafer holding table 10 within an area accessible by the chip separation facilitation unit 11 through the moving mechanism 19. As shown in FIG. 4, an actuation shaft 22a of an actuation mechanism 22 is connected to the connecting member 21. The actuation mechanism 22 is connected to a driving shaft 24a of a turning mechanism 24 through a bracket 23. The turning mechanism 24 is connected to a separation facilitation head attaching part 25. In accordance with this structure, the separation facilitation head attaching part 25 can be elevated or lowered and a turning operation can be realized that the position of the separation facilitation head attaching part 25 is changed to directions including a horizontal direction and a vertical direction. That is, the actuation mechanism 22 serves as an actuation unit for moving the position of the separation facilitation head attaching part 25 upward and downward. The turning mechanism 24 serves as a position changing unit for changing the position of the separation facilitation head attaching part 25 at least to the horizontal direction and the vertical direction.

The separation facilitation head 13 is detachably attached to a head attaching hole 25a provided in the separation facilitation head attaching part 25. In the separation facilitation head attaching part 25, a pin actuation part 27 for driving to elevate and lower the ejector pin 13a is incorporated. When the pin actuation part 27 is driven under a state that the separation facilitation head 13 is attached to the head attaching hole 25a, an actuation driving shaft 27a abuts on the ejector pin 13a to carry out an actuation operation. Thus, a separation facilitation operation is carried out that pushes up the chip 8 from the lower surface of the wafer sheet 7.

As the separation facilitation head 13, a plurality of heads having different kinds and sizes are prepared depending on the kinds of the chips 8 as objects. In the two separation facilitation head keeping parts 12 connected to two corner positions in the lower surface of the base plate 15, the plurality of different kinds of separation facilitation heads 13 are kept for changing. The operations of the separation facilitation head keeping part 12, the moving mechanism 19, the actuation mechanism 22 and the turning mechanism 24 are controlled by a control part 20. The control part 20 controls these operations to allow the chip separation facilitation unit 11 to access the separation facilitation head keeping part 12 so that a head changing operation can be carried out in which the separation facilitation head 13 attached to the separation facilitation head attaching part 25 can be changed for other separation facilitation head 13 kept in the separation facilitation head keeping part 12.

Namely, the separation facilitation head keeping part 12 is provided below the wafer holding table 10 within an area accessible by the chip separation facilitation unit 11 through the unit moving device to detachably hold the plurality of kinds of separation facilitation heads 13 in horizontal positions. Then, the control part 20 serves as a control unit that controls the moving mechanism 19, the separation facilitation head keeping part 12, the turning mechanism 24 and the actuation mechanism 22 to carry out the head changing operation for changing the separation facilitation head 13 between the separation facilitation head keeping part 12 and the separation facilitation head attaching part 25.

FIGS. 5A and 5B show a stretching operation and a sheet separating operation of the wafer sheet 7. FIG. 5A shows a state that the wafer ring 6 is set in the ring mounting slit 10c. From this state, as shown in FIG. 5B, the wafer holding table 10 is lowered to the base plate 15. Thus, the expand ring 15a is fitted into the opening part 10a. Then, an upper end part of the expand ring 15a abuts on the lower surface of the wafer sheet 7 to push up the wafer ring 6 in the slit 10c.

Then, when the wafer holding table 10 is further lowered, under a state that the wafer ring 6 is held in the slit 10c, the wafer sheet 7 is displaced upward relatively to the wafer holding table 10. That is, the wafer sheet 7 is displaced from an initial state to an outer direction of a holding surface by the wafer ring 6. Thus, the wafer sheet 7 is stretched in a planar direction of a sheet of the wafer sheet 7.

Then, under this state, an image of the chip 8 of an object to be picked up is taken by a camera (an illustration is omitted) located above the wafer holding table 10 to recognize a position. The moving mechanism 19 is moved on the basis of the recognized result of the position to position the separation facilitation head 13 to the chip 8 of an object to be separated among the chips 8 stuck to the wafer sheet 7. Here, the chip 8 located at a central part of the wafer sheet 7 is an object to be positioned.

After that, the mounting head 14 is moved in accordance with the above-described recognized result of the position to pick up the chip 8. When the chip is picked up by the mounting head 14, the separation facilitation head 13 is elevated to abut on and hold the lower surface of the wafer sheet 7. Then, under this state, the mounting head 14 adsorbs and picks up the chip 8 on the separation facilitation head 13, so that the chip 8 is separated and picked up from the wafer sheet 7.

Now, referring to FIGS. 6A and 6B, an attaching and detaching operation of the separation facilitation head 13 relative to the chip separation facilitation unit 11 will be described below. As shown in FIG. 6A, the attaching and detaching operation of the separation facilitation head 13 is carried out by driving the turning mechanism 24 to direct horizontally the head attaching hole 25a provided in the separation facilitation head attaching part 25. The head attaching hole 25a has a structure including a ball plunger 26 for engaging an engaging groove 13d provided on the outer periphery of the separation facilitation head 13 in the attaching hole of a form to which the separation facilitation head 13 is fitted.

When the separation facilitation head 13 is inserted into the head attaching hole 25a, as shown in FIG. 6B, the ball plunger 26 is fitted to the engaging groove 13d. Thus, the separation facilitation head 13 is attached to the separation facilitation head attaching part 25. On the outer peripheral surface of the separation facilitation head 13, an engaging hole 13b and a fitting hole 13c are provided in addition to the engaging groove 13d. An engaging claw 29a of an engaging arm 29 for an engagement provided in the separation facilitation head keeping part 12 is engaged with the engaging hole 13b and a positioning pin 30 for positioning is fitted to the fitting hole 13c.

Now, referring to FIGS. 7A and 7B, the structure of the separation facilitation head keeping part 12 will be described below. As shown in FIG. 7A, the separation facilitation head keeping part 12 has a box shaped head accommodating box 12a with one side opened fixed to the lower surface of the base plate 15. In the head accommodating box 12a, a plurality of (two in an example shown here) separation facilitation heads 13 are kept. In the head accommodating box 12a, the engaging arm 29 having the engaging claw 29a is provided that is engaged with the engaging hole 13b of the separation facilitation head 13. The engaging arm 29 is driven to swing upward and downward by an arm driving part 28. Thus, as shown in FIG. 7B, the separation facilitation head 13 can be engaged and disengaged. Further, on a bottom surface in the head accommodating box 12a, the positioning pin 30 is provided. The positioning pin 30 is fitted to the fitting hole 13c of the separation facilitation head 13. Thus, the separation facilitation head 13 is positioned at a delivery position between the separation facilitation head keeping part 12 and the separation facilitation head attaching part 25 in the separation facilitation head keeping part 12.

Now, referring to FIGS. 8A to 9D, a changing method of the separation facilitation head will be described that changes the separation facilitation head 13 in the chip mounting apparatus. The head changing operation for changing the separation facilitation head is carried out by controlling the moving mechanism 19, the separation facilitation head keeping part 12, the turning mechanism 24 and the actuation mechanism 22 by the control part 20 while the wafer ring 6 is changed by the wafer ring moving arm 9.

Figure 8A:
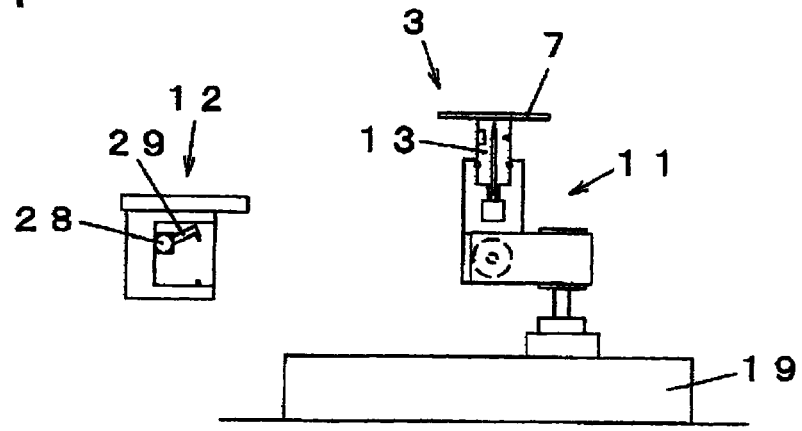
FIGS. 8A through 8D are explanatory views of an operation of a changing method of the separation facilitation head in the chip mounting apparatus of the embodiment of the present invention.

FIG. 8A shows a state that in the wafer ring holding part 3, the chip separation facilitation unit 11 is moved by the moving mechanism 19 and the separation facilitation head 13 is aligned with the position of the chip 8 to be picked up to carry out the separation facilitation operation of the chip 8. At this time, the separation facilitation head 13 is in a vertical position and abuts on the lower surface of the wafer sheet 7. Then, in the separation facilitation head keeping part 12, the engaging arm 29 is swung upward by the arm driving part 28 so that the separation facilitation head 13 can be accommodated. In such a way, during processes for repeatedly mounting the chips on the substrate 2, when the separation facilitation head 13 is changed, in accordance with a below-described procedure, the separation facilitation head 13 is changed.

Figure 8B:
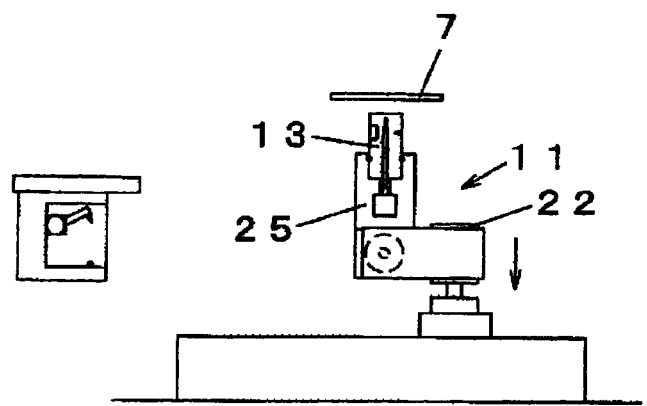
Figure 8C:
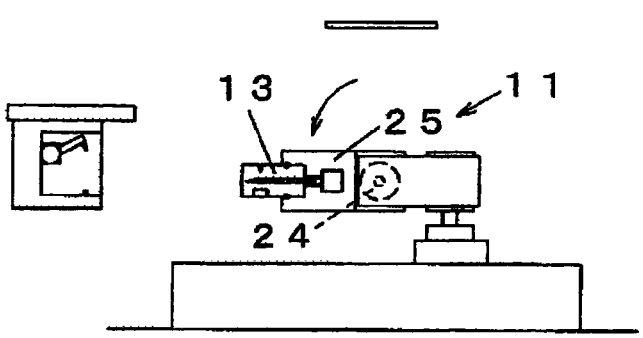
Figure 8D:
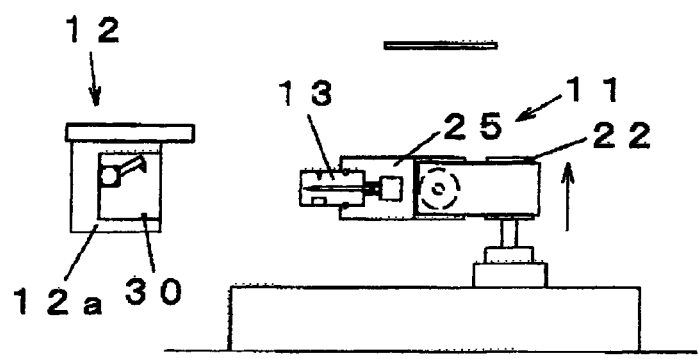

Initially, as shown in FIG. 8B, the actuation mechanism 22 is driven to lower the separation facilitation head attaching part 25 together with the separation facilitation head 13. Then, as shown in FIG. 8C, the turning mechanism 24 is driven to change the position of the separation facilitation head attaching part 25 to a horizontal position from the vertical position. Then, as shown in FIG. 8D, the actuation mechanism 22 is driven to elevate the separation facilitation head attaching part 25 to set the position of a height of the separation facilitation head 13 to a height at which the separation facilitation head 13 can be inserted into the head accommodating box 12a.

Figure 9A:
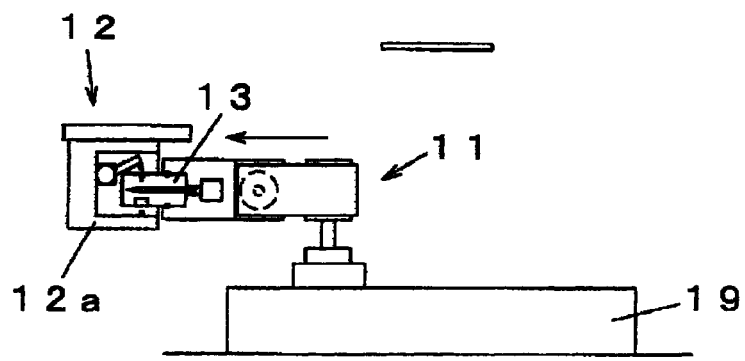
FIGS. 9A through 9D are explanatory views of an operation of a changing method of the separation facilitation head in the chip mounting apparatus of the embodiment of the present invention.
Figure 9B:
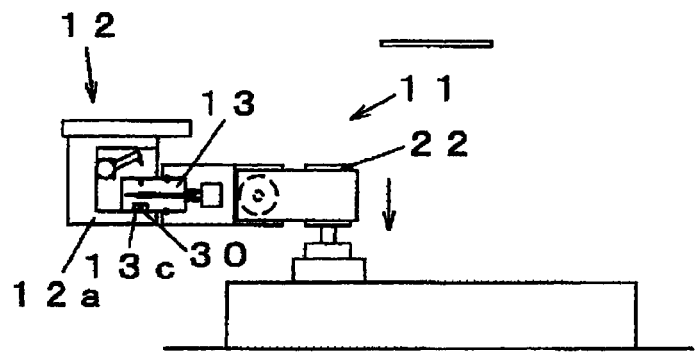

After that, as shown in FIG. 9A, the entire part of the chip separation facilitation unit 11 is moved by the moving mechanism 19 to access the separation facilitation head keeping part 12, so that the separation facilitation head 13 is inserted into the head accommodating box 12a. Then, as shown in FIG. 9B, the actuation mechanism 22 is driven to lower the separation facilitation head 13. Thus, the positioning pin 30 is fitted to the fitting hole 13c of the separation facilitation head 13 so that the separation facilitation head 13 is aligned with a delivery position in the head accommodating box 12a.

Figure 9C:
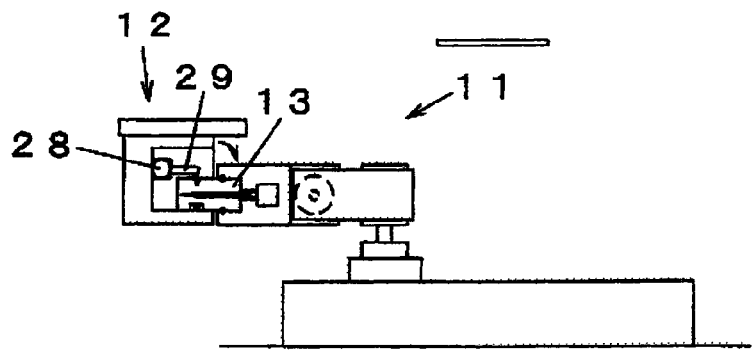
Figure 9D:
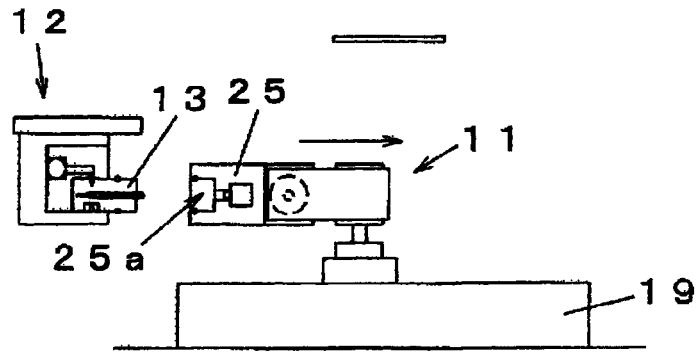

Subsequently, as shown in FIG. 9C, the arm driving part 28 is driven to swing the engaging arm 29 downward and to engage the separation facilitation head 13 by the engaging claw 29a (see FIG. 7A). Then, after that, as shown in FIG. 9D, the moving mechanism 19 is driven to move the entire part of the chip separation facilitation unit 11 backward. Thus, the separation facilitation head 13 held by the separation facilitation head keeping part 12 is separated from the head attaching hole 25a of the separation facilitation head attaching part 25 to deliver the separation facilitation head 13 to the separation facilitation head keeping part 12.

The above-described operation shows an operation for delivering the separation facilitation head 13 attached to the separation facilitation head keeping part 12. To attach the separation facilitation head 13 kept and accommodated in the separation facilitation head keeping part 12 to the separation facilitation head attaching part 25, the above-described operations may be respectively carried out in an opposite order. Thus, the changing operation of the separation facilitation head 13 is carried out that the separation facilitation head 13 already attached to the separation facilitation head attaching part 25 is returned to the separation facilitation head keeping part 12 and other separation facilitation head 13 kept in the separation facilitation head keeping part 12 is newly attached to the separation facilitation head attaching part 25.

Specifically, the changing method of the separation facilitation head 13 comprises: a position changing step that changes the position of the separation facilitation head attaching part 25 to which the separation facilitation head 13 is detachably attached in the chip separation facilitation unit 11 at least to the horizontal direction and the vertical direction; an access step that allows the chip separation facilitation unit 11 to access to the separation facilitation head keeping part 12; and a head delivery step that delivers the separation facilitation head 13 between the separation facilitation head keeping part 12 and the separation facilitation head attaching part 25.

As described above, the chip mounting apparatus shown in this embodiment includes the separation facilitation head keeping part 12 that detachably keeps a plurality of kinds of separation facilitation heads 13 in the wafer ring holding part 3 to automatically carry out a head changing operation for changing the separation facilitation head 13 between the separation facilitation head keeping part 12 and the separation facilitation head attaching part 25. Thus, the separation facilitation head 13 can be automatically changed to improve the operation rate of the apparatus, as compared with a usual apparatus of a structure that while the operation of the apparatus is stopped, a machine operator needs to manually carry out the same operation.

In the above-described embodiment, a system that the chip 8 is pushed up by the ejector pin 13a as the separation facilitation head 13, however, the present invention is not limited to this system. For instance, a separation facilitation mechanism except the ejector pin may be employed, for instance, a system that facilitates the separation of the chip 8 from the wafer sheet 7 by sucking the chip under vacuum from the lower surface side of the wafer sheet 7.

The chip mounting apparatus and the changing method of the separation facilitation head in the chip mounting apparatus of the present invention can effectively improve the operation rate of the apparatus by automatically changing the separation facilitation head and can be used in the field of a mounting operation for mounting on the substrate the chips supplied under a state that the chips are stuck to the wafer sheet.

The present application is based upon and claims the benefit of the priority of Japanese patent application No. 2007-101503, filed on Apr. 9, 2007, the entire contents of which are incorporated herein by reference.

What is claimed is:

1. A separation facilitation head changing method for changing a separation facilitation head in a chip mounting apparatus that mounts on a substrate a chip supplied under a state that the chip is stuck to a wafer sheet, the method comprising the steps of: providing said chip mounting apparatus comprising: a substrate holding part that holds the substrate;
    a wafer ring holding part that holds a wafer ring on which the wafer sheet is extended;
    a mounting head that mounts the chip picked up from the wafer sheet on the substrate held on the substrate holding part;
    a chip separation facilitation unit provided with a separation facilitation head that facilitates the separation of the chip from the wafer sheet when the chip is picked up from the wafer sheet;

a unit moving device that moves the chip separation facilitation unit horizontally relatively to the wafer ring holding part; and a separation facilitation head keeping part that is provided below the wafer ring holding part within a range accessible by the chip separation facilitation unit through the unit moving device to detachably keep a plurality of kinds of separation facilitation heads in horizontal position; changing the position of the separation facilitation head attaching part to which the separation facilitation head is detachably attached in the chip separation facilitation unit at least to the horizontal direction and the vertical direction;

allowing the chip separation facilitation unit to access to the separation facilitation head keeping part; and delivering the separation facilitation head between the separation facilitation head keeping part and the separation facilitation head attaching part.

2. A separation facilitation head changing method in a chip mounting apparatus according to claim 1, wherein the chip mounting apparatus includes a wafer ring changing unit that changes the wafer ring for other wafer ring accommodated in a magazine and while the wafer ring is changed by the wafer ring changing unit, the separation facilitation head is changed.

* * * * *